United States Patent
Adams et al.

[11] Patent Number: 6,123,502
[45] Date of Patent: Sep. 26, 2000

[54] SUBSTRATE HOLDER HAVING VACUUM HOLDING AND GRAVITY HOLDING

[75] Inventors: Douglas R. Adams, Tewksbury, Mass.; Robert T. Caveney, Windham, N.H.; Twan T. Ha, Framingham; Brian M. Lucas, Marblehead, both of Mass.

[73] Assignee: Brooks Automation, Inc., Chelmsford, Mass.

[21] Appl. No.: 08/889,516

[22] Filed: Jul. 8, 1997

[51] Int. Cl.[7] .................................................. G03F 7/20
[52] U.S. Cl. .................... 414/752.1; 901/49; 414/941; 414/744.5; 414/800
[58] Field of Search .................... 414/217, 752, 414/940, 744.5; 901/49

[56] References Cited

U.S. PATENT DOCUMENTS

| | | | |
|---|---|---|---|
| 4,213,698 | 7/1980 | Firtion et al. | 355/77 |
| 4,275,978 | 6/1981 | Brooks et al. | 414/156 |
| 4,653,793 | 3/1987 | Guinot et al. | 294/86.4 |
| 4,666,366 | 5/1987 | Davis | 414/749 |
| 4,715,921 | 12/1987 | Maher et al. | 156/345 |
| 4,730,976 | 3/1988 | Davis et al. | 414/749 |
| 4,813,742 | 3/1989 | Klem | 414/941 |
| 4,909,701 | 3/1990 | Hardegen et al. | 414/749 |
| 4,951,601 | 8/1990 | Maydan et al. | 118/719 |
| 5,180,276 | 1/1993 | Hendrickson | 414/752 |
| 5,622,400 | 4/1997 | George | 414/941 |

FOREIGN PATENT DOCUMENTS

| | | | |
|---|---|---|---|
| 1-305533 | 12/1989 | Japan . | |
| 2-10753 | 1/1990 | Japan . | |
| 2-12939 | 1/1990 | Japan . | |
| 64-16418 | 8/1990 | Japan | 414/941 |
| 4-62951 | 2/1992 | Japan . | |
| 4-65854 | 3/1992 | Japan | 414/941 |
| 5-253870 | 10/1993 | Japan . | |
| 1131812 | 12/1984 | U.S.S.R. . | |
| WO 94/23911 | 10/1994 | WIPO . | |

*Primary Examiner*—Gregory A. Morse
*Attorney, Agent, or Firm*—Perman & Green, LLP

[57] ABSTRACT

A substrate processing apparatus having a substrate transport with substrate holders. The holders are adapted to vacuum hold substrates and thereby allow for rapid movement of the substrates without risk that the substrates will move off of the holders. If vacuum holding of a substrate on a holder fails, the movement of the substrate holder is automatically changed to provide a less rapid gravity only holding of the substrate on the holder.

17 Claims, 5 Drawing Sheets

SUBSTRATE HOLDER HAVING VACUUM HOLDING AND GRAVITY HOLDING

BACKGROUND OF THE INVENTION

1. Field of the Invention

The present invention relates to substrate processing and, more particularly, to moving substrates.

2. Prior Art

U.S. Pat. No. 4,715,921 discloses a substrate processing apparatus. U.S. Pat. No. 4,213,698 discloses a holder for vacuum holding a substrate. Gravity only substrate holders are also known in the art. Typical vacuum gripping substrate holders have a reputation for dropping wafers when they are moved about one percent of the time due to a failure of vacuum holding to initially occur. This often requires the substrate processing apparatus to be stopped and requires operator interaction. For a 100 wafer per hour throughput apparatus, although only one wafer per hour is not properly vacuum held, stopping the apparatus and operator interaction could reduce the throughput about 25% to only 75 wafers per hour. However, vacuum holders are much faster than gravity only holders because gravity only holders can only be accelerated and decelerated at a limit of about 0.1 g to prevent scratching of the wafer.

SUMMARY OF THE INVENTION

In accordance with one method of the present invention, a method of moving a substrate in a substrate processing apparatus is provided comprising steps of vacuum holding the substrate on a substrate holder; moving the substrate holder to thereby move the substrate; sensing vacuum pressure being applied by a vacuum holding system to the substrate on the substrate holder; and moving the substrate holder at reduced acceleration and deceleration rates for stationary gravity holding of the substrate on the holder when the step of sensing indicates that the vacuum pressure of the vacuum holding system is insufficient to stationarily vacuum holder the substrate on the holder.

In accordance with another method of the present invention, a method of moving the substrate in a substrate processing apparatus is provided comprising steps of sensing a predetermined characteristic of holding of the substrate on a substrate holder of the substrate processing apparatus; and changing movement of the substrate holder between two different types of movements based upon the sensed predetermined characteristic. The substrate is moved with the substrate holder by a first one of the two different types of movements when the predetermined characteristic is sensed to be at a first level, and the substrate is moved with the substrate holder by a second one of the two different types of movements when the predetermined characteristic is sensed to be at a different second level.

In accordance with one embodiment of the present invention, a substrate transport is provided having a substrate holder for moving a substantially flat substrate. The substrate holder has means for vacuum holding the substrate to the holder. A safety system is provided for preventing the substrate from unintentionally moving on the substrate holder. The safety system comprises means for changing movement of the holder from a relatively fast acceleration movement, when the holder is vacuum holding the substrate, to a reduced acceleration gravity only holding movement when the substrate is on the holder and not held by vacuum to the holder.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENT

Figure 1:
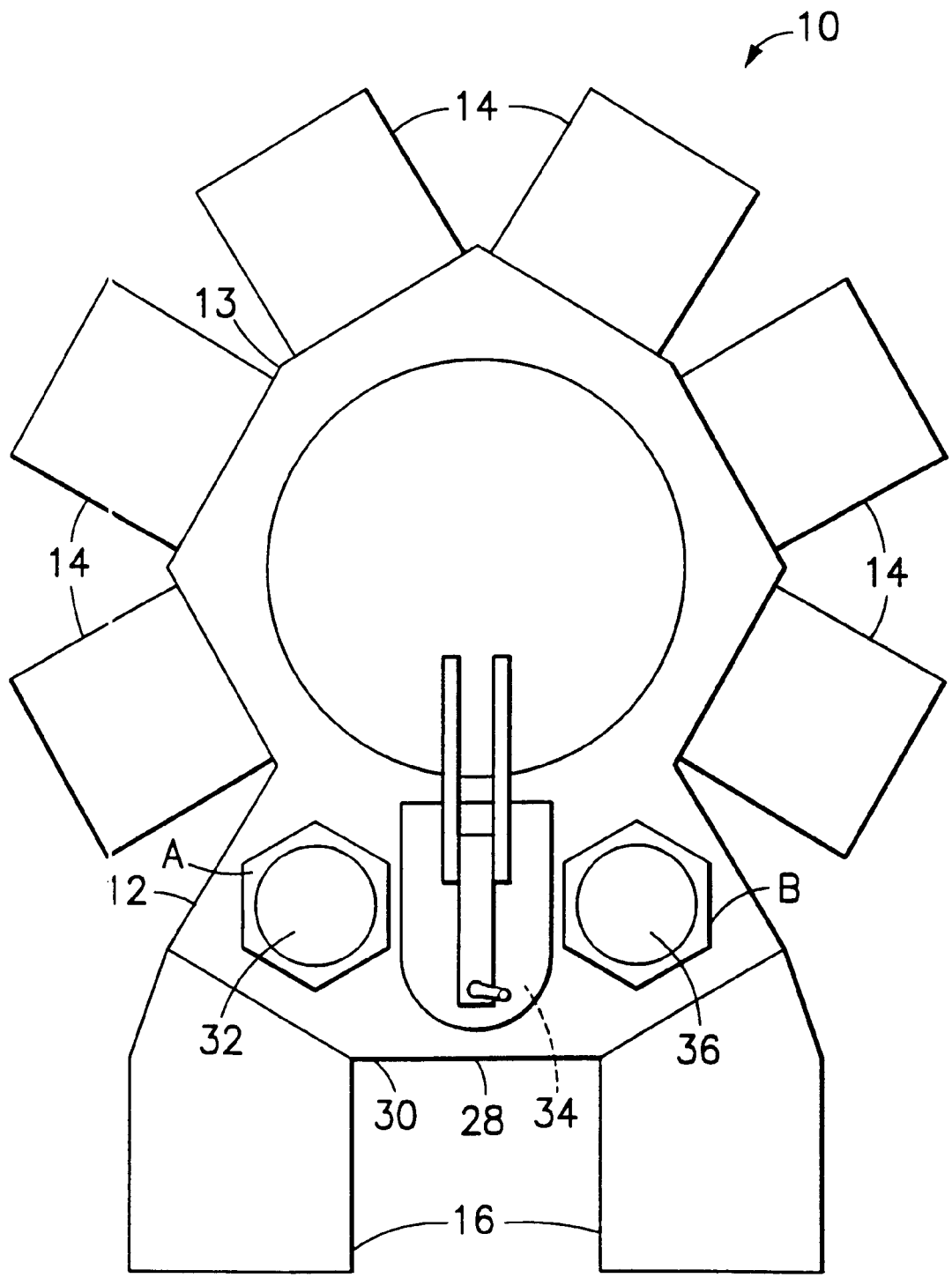
FIG. 1 is a top plan view of a substrate processing apparatus incorporating features of the present invention.

Referring to FIG. 1, there is shown a schematic top view of a substrate processing apparatus 10 incorporating features of the present invention. Although the present invention will be described with reference to the single embodiment shown in the drawings, it should be understood that features of the present invention may be embodied in many different types of alternate embodiments, different types of substrate processing apparatus, and different types of substrate transport apparatus. In addition, any suitable size, shape or type of elements or materials could be used.

Figure 2:
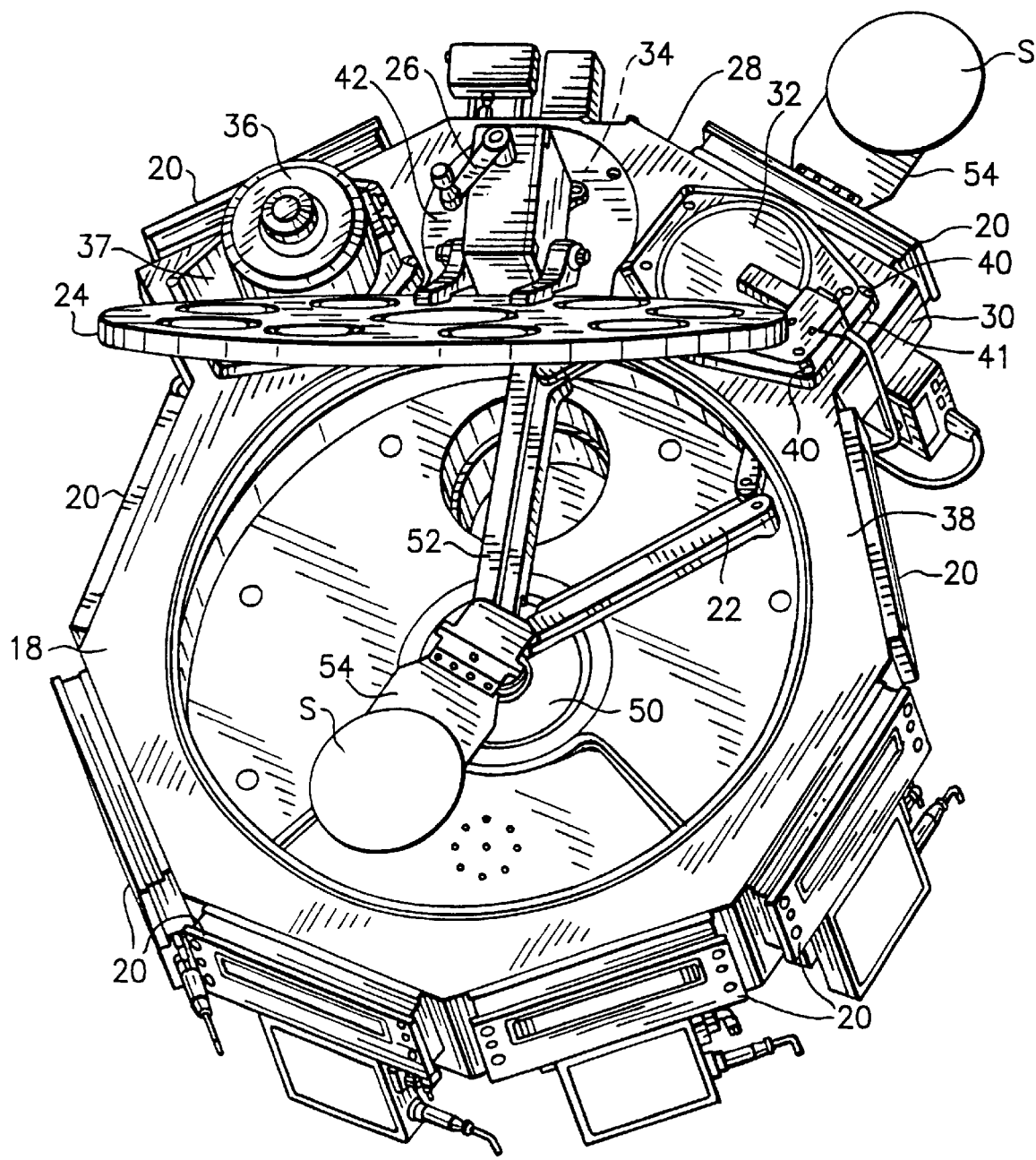
FIG. 2 is a perspective view of the transport of the apparatus shown in FIG. 1.

The apparatus 10 includes a main section 12 which forms a transport 13, substrate processing modules 14, and substrate holding modules 16. Referring also to FIG. 2, a perspective view of the main section 12 is shown. He main section 12 has a frame 18 with multiple side apertures having door sections 20. The modules 14, 16 are connected to the door sections 20. The substrate processing modules 14 and the substrate holding modules 16 are well known in the art and, therefore, are not described further. However, the substrate holding modules 16 could be load locks connected to a substrate supply module (not shown). The substrates S could be semi-conductor wafers, flat panel displays, or any other type of substrate. The main section 12 has a substrate transport mechanism 22 for moving the substrates S among the modules 14, 16. A similar substrate transport mechanism is described in PCT patent publication No. WO 94/23911 which is hereby incorporated by reference in its entirety. However, any suitable type of substrate transport mechanism can be used. The frame 18 includes a movable top cover 24 and a cover movement crank 26. The front end 28 of the main section 12 has an extended section 30. The section 30 holds an aligner 32, a buffer 34 and a cooler 36.

The buffer 34 is located directly between the aligner 32 and the cooler 36. The buffer can hold one or more substrates while waiting for the mechanism 22 to move the substrate(s) into one of the modules 14, 16. However, the buffer 34 need not be provided. The aligner 32 is used to align the substrates as is known in the art. In this embodiment, the aligner 32 is a modular drop-in unit that is inserted into the frame 18 through a hole in the top surface 38 of the frame 18. Four screws 40 are then used to fix a mounting flange 41 of the aligner 32 to the frame 18. The crank 26 is mounted to the frame 18 by a plate 42. The plate 42 is located over the buffer 34. The plate 42 can be removed from the frame 18 to allow a user to gain access to the buffer.

The cooler 36 is also a modular drop-in unit that is inserted into the frame 18 through a hole in the top surface 38. Four screws are then used to fix the mounting flange 37 to the frame 18. The mounting flange 37 is the same size and shape as the aligner's mounting flange 41. The frame 18, aligner 32 and cooler 36 have been constructed such that the frame 18 can accept either the aligner 32 or the cooler 36 at the two locations A and B (See FIG. 1). Thus, the main section 12 could have two aligners or two coolers, or the aligner and cooler could be located at opposite sides. This modular construction allows the manufacturer to relatively easily configure the apparatus 10 to specific requirements. If no cooler and/or aligner is needed in the main section 12, sealing plates (not shown) need only be connected to the frame 18 in place of the cooler and/or aligner. It should be noted, however, that features of the present invention could be used with alternate types of transports and frame/aligner/cooler arrangements.

Figure 3:
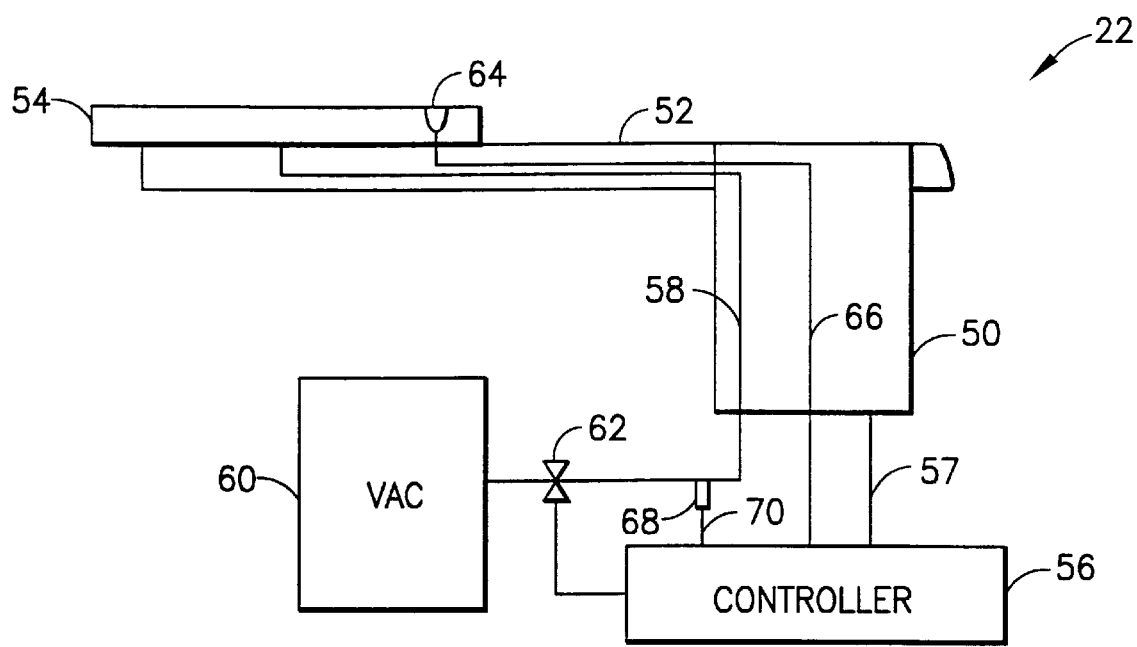
FIG. 3 is a partial schematic view of the transport mechanism used in the transport shown in FIG. 2.

Referring also to FIG. 3, a partial schematic view of the transport mechanism 22 is shown. The transport mechanism 22 has a drive section 50, a movable arm section 52, and two end effectors or substrate holders 54. The drive section 50 is connected by wires 57 to the controller 56 and controlled by a controller 56. The holders 54 are each connected by a conduit 58 to a source of vacuum 60. Substrate holders having vacuum holding are well known in the art. A valve 62 in each conduit 58 is connected to the controller 56. The controller 56 is preferably a computer controller which can open and close the valves 62. The holders 54 are adapted to vacuum hold a substrate thereon when its respective valve 62 is open. The holders 54 also each comprise an optical sensor 64 which is connected to the controller 56 by a wire 66. The sensors 64 signal the controller 56 of the presence or absence of a substrate on their respective holders. A vacuum pressure switch 68 is connected to each conduit 58. Each switch 68 is connected by a wire 70 to the controller 56.

The controller 56 is adapted to control movement of the drive section 50 to at least two different movement setting; a fast setting and a slow setting. The drive section normally operates in the fast setting. The fast setting generally comprises the drive section 50 moving the movable arm section 52 at relatively fast acceleration and deceleration rates, such as about 0.7 g, which would ordinarily cause the substrate on the holder to move off of the holder if vacuum holding was not provided. Although the controller 56 normally selects the fast setting, in the event vacuum holding of a substrate at either or both of the substrate holders 54 fails, the transport mechanism is adapted to automatically switch its mode of operation from the fast setting to the slow setting until the non-vacuum held substrate is unloaded from its substrate holder. The slow setting generally comprises the drive section 50 moving the movable arm section 52 at relatively slow or reduced acceleration and deceleration rates, such as about 0.1 g. This is selected to allow gravity holding of the substrate on the holder at a stationary position. This has been predetermined based upon the weight of the substrates, the coefficient of friction between the substrates and the holders, and the area of contact between the substrates and the holders. Thus, the transport mechanism 22 can transport the substrate without vacuum holding at the slow setting without the substrates moving on or off of the holders. After the failed vacuum held substrate is unloaded, the transport mechanism can revert back to its fast setting until another non-vacuum held substrate is detected.

Figure 4:
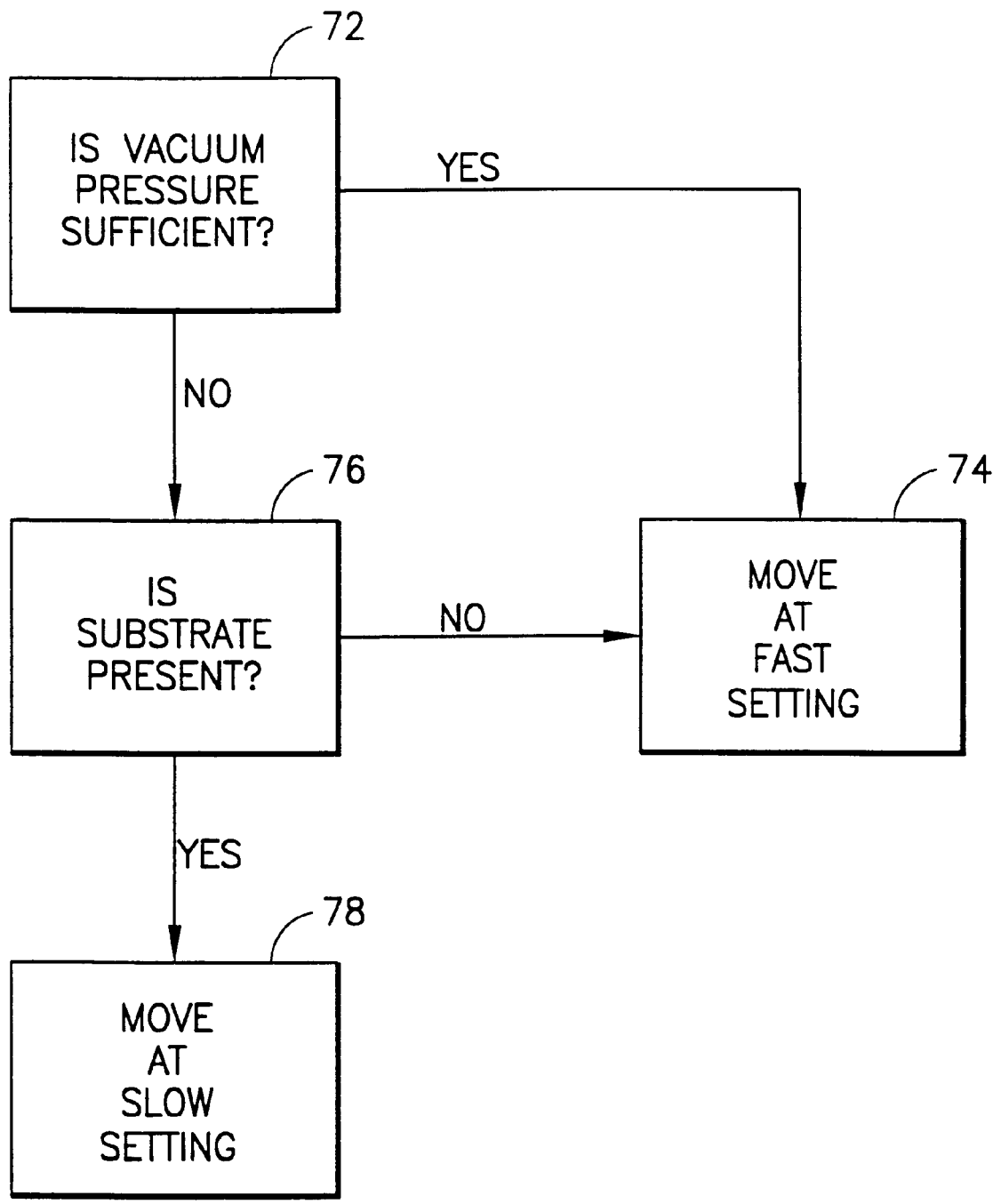
FIG. 4 is a block diagram of the method used by the controller to determine if a substrate holder could be moved at a fast setting or a slow setting.

Once a substrate is loaded on its respective holder 54, the controller 56 opens the holder's valve 62 to supply vacuum pressure to the holder. About 99% of the time a proper vacuum hold will be formed by the holder 54 to prevent unintentional movement of the substrate on the holder as the holder is moved by the drive section 50 and arm section 52. Referring also to FIG. 4, the vacuum pressure switch 68 signals the controller 56 at block 72 whether the vacuum pressure is sufficient to keep the substrate vacuum held to the holder 54. The vacuum pressure may partially hold the substrate, even when there is not proper vacuum holding for the fast setting, but the fast setting should only be used if the vacuum pressure is at a predetermined level to insure that the substrate will be held on the holder during the relatively rapid acceleration and deceleration in the fast setting. In an alternate embodiment, the actual rates of acceleration and deceleration could be varied in direct relationship to actual vacuum pressure readings at a pressure gage. The controller 56 would be preprogrammed with acceleration and deceleration rates for different actual pressure readings. If the vacuum pressure is below a predetermined level, such as below 50 Torr, this indicates that the vacuum pressure on the substrate is sufficient to indicate proper vacuum holding of the substrate on the holder and, thus, the holder can be moved at the fast setting as indicated by block 74.

If the vacuum pressure is above the predetermined level, this indicates that the substrate is not properly vacuum held on the holder 54 and may move on or off of the holder as the holder is moved in the fast setting. Thus, if a substrate is located on the holder, the holder should be moved at the slower gravity holding mode. As illustrated by block 76, the system determines if a substrate is present on the holder. This is accomplished by use of the sensor 64. However, in alternate embodiments, other types of sensors could be used. If the sensor does not sense the presence of a substrate on the holder, the holder can be moved at the fast setting. However, if a substrate is sensed on the holder, then the controller will move the drive section 50 at the slower setting as is indicated by block 78.

Figure 5:
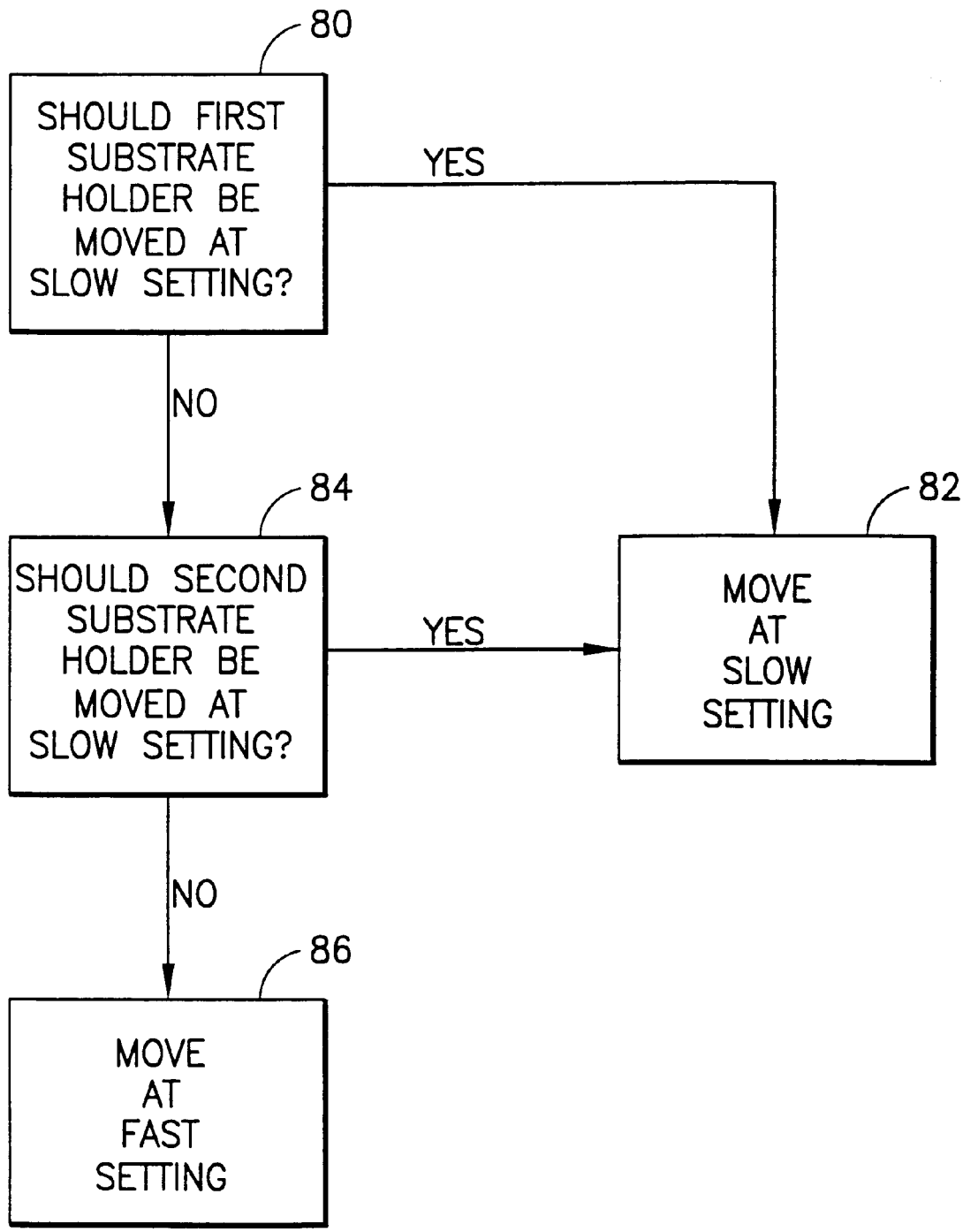
FIG. 5 is a block diagram of the method used by the controller to determine if a transport mechanism could be moved at a fast setting or a slow setting.

In the embodiment described above, the transport mechanism 22 has two substrate holders connected to the same drive section 50 and movable arm section 52. With this type of embodiment the controller 56 is configured to select the fast setting only if both holders could be safely moved in the fast setting. Referring also to FIG. 5, as indicated by block 80, the controller determines if the first substrate holder should be moved at the slow setting. If yes, then the controller 56 moves the drive section 50 at the slow setting as indicated by block 82. If no, the controller 56 then determines if the second substrate holder should be moved at the slow setting as indicated by block 84. If yes, then the drive section 50 moves at the slow setting as indicated by block 82. If no, then the controller 56 has the drive section 50 move at the fast setting as indicated by block 86. With this type of control system, even if one of the holders 54 has a proper vacuum hold of its respective wafer, so long as the other holder does not have a proper vacuum hold of its respective wafer the controller 56 directs the drive section 50 to move at the safer slower setting. In an alternate embodiment, such as when the two substrate holders are separately movably, the controller could independently select their respective settings. The present invention could also be used with a substrate transport that has only one substrate holder or more than two substrate holders.

In a preferred embodiment, the controller 56 makes the determination of which mode setting to select when a substrate is initially loaded on its respective holder. If a non-vacuum holding condition is sensed, the controller then retains the slow setting until the subject substrate is unloaded from the holder. However, in an alternate embodiment, the controller could be programmed to sense whether non-vacuum holding occurs during any or all times after the substrate is loaded on the holder and, if a non-vacuum holding condition occurs after initial loading, then execute a preprogrammed transfer from the fast setting to the slow setting to attempt to prevent the substrate from moving on or off of the holder. Thus, the setting can be shifted while the transfer mechanism is moving. In another alternate embodiment, settings in addition to or other than the fast setting and the slow setting could be provided. Two modes of holding the substrates to the holders have been described above; vacuum holding and frictional gravity holding when the vacuum holding fails. In alternate embodiments other modes of holding, such as perimeter clamping, could be alternatively or additionally provided. With the present invention, one failed vacuum holding grip during a typical 100 substrate per hour transfer process will result in less than a 0.2% reduction in throughput. Whereas in the prior art, a tool stop and required operator interaction from a substrate falling off of a holder from a failed vacuum grip could result in a 25% reduction in throughput. The advantage from temporarily slowing down the operation of the transport mechanism when a failed vacuum grip occurs far exceeds the throughput in the prior art because tool stop and operator interaction is required much less often with the present invention. Thus, the present invention provides the speed of a vacuum holding transport mechanism for the majority of its operation, but also reduces the bad throughput results that occurred in the prior art when vacuum holding failed. The present invention provides a hybrid system that interacts with the actual holding of the substrate on the holder to increase the actual throughput of the transport mechanism over the prior art.

It should be understood that the foregoing description is only illustrative of the invention. Various alternative and modifications can be devices by those skilled in the art without departing from the scope of the invention. Accordingly, the present invention is intended to embrace all such alternative, modifications and variances which fall within the scope of the appended claims.

What is claimed is:

1. A method of moving a substrate in a substrate processing apparatus comprising steps of:

vacuum holding the substrate on a substrate holder;

moving the substrate holder to thereby move the substrate;

sensing vacuum pressure being applied by a vacuum holding system to the substrate on the substrate holder; and moving the substrate holder at gravity holding acceleration and deceleration rates based upon substrate weight, coefficients of friction, and contact area between the substrate and the substrate holder to allow for stationary gravity holding of the substrate on the holder when the step of sensing indicates that the vacuum pressure of the vacuum holding system is insufficient to stationary vacuum hold the substrate on the holder.

2. A method as in claim 1 further comprising sensing presence of the substrate on the substrate holder.

3. A method as in claim 1 wherein the step of sensing comprises a pressure switch connected to the vacuum holding system of the substrate holder, and wherein the pressure switch is connected to a computer controller that controls movement of the substrate holder, the pressure switch sending a signal to the computer controller when the pressure in the vacuum holding system is above a predetermined pressure.

4. A method as in claim 1 wherein the step of sensing occurs when the substrate is initially loaded on the substrate holder and the step of moving the substrate holder at reduced acceleration and deceleration rates occurs only if the vacuum pressure is not at a predetermined level when the substrate is initially loaded on the substrate.

5. A method as in claim 1 wherein the reduced acceleration and deceleration rates are limited to about a 0.1 g limit.

6. A method as in claim 1 further comprising automatically switching between relatively fast acceleration and deceleration rates and the reduced acceleration and deceleration rates by a computer controller based upon the step of sensing.

7. A method as in claim 6 further comprising moving the substrate holder at the relatively fast acceleration and deceleration rates when a substrate is not on the substrate holder.

8. A method as in claim 1 further comprising removing the substrate from the holder, loading another substrate on the holder, and moving the substrate holder at relatively fast acceleration and deceleration rates if the vacuum pressure being applied by the vacuum holding system indicates that vacuum holding of the substrate on the holder is occurring.

9. A method of moving a substrate in a substrate processing apparatus, the method comprising steps of:

sensing a predetermined characteristic of holding of the substrate on a substrate holder of the substrate processing apparatus; and changing movement of the substrate holder between two different types of movements based upon the sensed predetermined characteristic, wherein the substrate is moved with the substrate holder by a first one of the two different types of movements when the predetermined characteristics is sensed to be at a first level, and the substrate is moved with the substrate holder by a second one of the two different types of movements when the predetermined characteristic is sensed to be at a different second level wherein the second one of the two different types of movement is predetermined based upon substrate weight, coefficients of friction, and surface area contact between the substrate and the substrate holder.

10. A method as in claim 9 wherein the predetermined characteristic is vacuum pressure of a vacuum holding system for vacuum holding the substrate to the substrate holder.

11. A method as in claim 9 wherein the first type of movement is a faster acceleration rate than the second type of movement.

12. A method as in claim 11 further comprising sensing presence of a substrate on the substrate holder and moving the substrate holder at the faster acceleration rate, regardless of the sensed predetermined characteristic, when no substrate is sensed on the substrate holder.

13. A method as in claim 9 wherein the step of sensing occurs when the substrate is initially loaded on the substrate holder and moving the substrate holder in the second type of movement is at reduced acceleration and deceleration rates relative to the first type of movement and occurs only if the second level of the predetermined characteristic is present when the substrate is initially loaded on the substrate.

14. A method as in claim 9 wherein a computer controller automatically switches between the two types of movements based upon the sensed predetermined characteristic.

15. In a substrate transport having a substrate holder for moving a substantially flat substrate, the substrate holder having means for vacuum holding the substrate to the holder, wherein the improvement comprises:

a safety system for preventing the substrate from unintentionally moving on the substrate holder, the safety system comprising means for changing movement of the holder from a relatively fast acceleration movement, when the holder is vacuum holding the substrate, to a reduced acceleration gravity holding movement when the substrate is on the holder and not held by vacuum to the holder.

16. A substrate transport as in claim 15 wherein the safety system comprises a vacuum pressure switch which senses vacuum pressure in the means for vacuum holding.

17. A substrate as in claim 16 further comprising an optical substrate sensor for sensing an absence of the substrate on the holder and deactivating the safety system.

* * * * *